(12) United States Patent
Bhushan et al.

(10) Patent No.: US 11,018,093 B2
(45) Date of Patent: May 25, 2021

(54) MAGNETIC SHIELDING OF STT-MRAM IN MULTICHIP PACKAGING AND METHOD OF MANUFACTURING THE SAME

(71) Applicant: GLOBALFOUNDRIES Singapore Pte. Ltd., Singapore (SG)

(72) Inventors: Bharat Bhushan, Singapore (SG); Juan Boon Tan, Singapore (SG); Boo Yang Jung, Singapore (SG); Wanbing Yi, Singapore (SG); Danny Pak-Chum Shum, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/432,500

(22) Filed: Jun. 5, 2019

(65) Prior Publication Data
US 2019/0287921 A1    Sep. 19, 2019

Related U.S. Application Data

(62) Division of application No. 15/878,139, filed on Jan. 23, 2018, now Pat. No. 10,361,162.

(51) Int. Cl.
| | |
|---|---|
| *H01L 23/552* | (2006.01) |
| *G11C 11/16* | (2006.01) |
| *H01L 27/22* | (2006.01) |
| *H01L 25/16* | (2006.01) |
| *H01L 23/485* | (2006.01) |

(Continued)

(52) U.S. Cl.
CPC .......... *H01L 23/552* (2013.01); *G11C 11/161* (2013.01); *H01L 21/4857* (2013.01); *H01L 21/561* (2013.01); *H01L 21/565* (2013.01); *H01L 21/568* (2013.01); *H01L 21/78* (2013.01); *H01L 23/3128* (2013.01); *H01L 23/485* (2013.01); *H01L 25/16* (2013.01); *H01L 27/222* (2013.01)

(58) Field of Classification Search
CPC . H01L 32/4857; H01L 21/561; H01L 21/565; H01L 21/78; H01L 23/3128; H01L 23/485; H01L 23/552; H01L 25/16; H01L 27/222; H01L 23/145; H01L 24/96; H01L 24/19; H01L 21/568; H01L 23/5383; H01L 2224/12105; H01L 2224/96; H01L 2224/04105; H01L 2224/19; H01L 23/49816; H01L 21/48; H01L 21/56; H01L 23/31; H01L 27/22; G11C 11/161; G11C 11/1695
USPC ......................... 257/659, 773, 778, 686, 685
See application file for complete search history.

(56) References Cited

U.S. PATENT DOCUMENTS

| | | |
|---|---|---|
| 6,559,521 B2 | 5/2003 | Tuttle |
| 7,183,617 B2 | 2/2007 | Wang et al. |

(Continued)

*Primary Examiner* — Alexander O Williams
(74) *Attorney, Agent, or Firm* — Ditthavong, Steiner & Mlotkowski

(57) ABSTRACT

Methodologies and an apparatus for enabling magnetic shielding of stand alone MRAM are provided. Embodiments include placing MRAM dies and logic dies on a first surface of a mold frame; forming a top magnetic shield over top and side surfaces of the MRAM dies; forming a mold cover over the MRAM dies, FinFET dies and mold frame; removing the mold frame to expose a bottom surface of the MRAM dies and FinFET dies; and forming a bottom magnetic shield over the bottom surface of the MRAM dies.

18 Claims, 5 Drawing Sheets

(51) Int. Cl.
*H01L 23/31* (2006.01)
*H01L 21/48* (2006.01)
*H01L 21/56* (2006.01)
*H01L 21/78* (2006.01)

(56) References Cited

U.S. PATENT DOCUMENTS

| | | | |
|---|---|---|---|
| 8,884,422 B2 | 11/2014 | Goh et al. | |
| 9,000,584 B2 | 4/2015 | Lin et al. | |
| 10,276,784 B1* | 4/2019 | Yu | H01L 43/02 |
| 10,340,311 B2* | 7/2019 | Yakabe | H01L 43/02 |
| 10,347,826 B1* | 7/2019 | Bhushan | H01L 23/3192 |
| 2004/0032010 A1* | 2/2004 | Kools | H01L 43/08 |
| | | | 257/659 |
| 2012/0211846 A1* | 8/2012 | Li | H01L 23/552 |
| | | | 257/421 |
| 2015/0243881 A1* | 8/2015 | Sankman | G06F 1/1633 |
| | | | 361/679.55 |
| 2016/0284761 A1* | 9/2016 | Zhou | H01L 23/552 |
| 2016/0284981 A1 | 9/2016 | Bhushan et al. | |
| 2016/0359100 A1 | 12/2016 | Bhushan et al. | |
| 2017/0033058 A1* | 2/2017 | Li | H01L 23/49524 |
| 2017/0047507 A1* | 2/2017 | Seo | H01L 24/73 |
| 2018/0130782 A1* | 5/2018 | Lee | H01L 25/0655 |
| 2018/0315795 A1* | 11/2018 | Chen | H01L 27/228 |
| 2018/0351078 A1 | 12/2018 | Bharat et al. | |
| 2019/0051613 A1* | 2/2019 | Ugge | H01L 23/49534 |
| 2019/0096956 A1* | 3/2019 | Gao | H05K 3/32 |
| 2019/0122899 A1* | 4/2019 | Kwon | H01L 23/552 |
| 2019/0237407 A1* | 8/2019 | Lee | H01L 23/3128 |
| 2019/0238134 A1* | 8/2019 | Lee | H01L 29/7883 |
| 2019/0287868 A1* | 9/2019 | Zelikson | H01L 24/17 |
| 2019/0287908 A1* | 9/2019 | Dogiamis | H01L 23/5385 |
| 2019/0304915 A1* | 10/2019 | Jain | H01L 23/5385 |
| 2019/0385977 A1* | 12/2019 | Elsherbini | H01L 25/50 |
| 2019/0393125 A1* | 12/2019 | Koller | H01L 23/3121 |
| 2020/0006235 A1* | 1/2020 | Aleksov | H01L 23/5385 |
| 2020/0051894 A1* | 2/2020 | Wan | H01L 23/42 |
| 2020/0273840 A1* | 8/2020 | Elsherbini | H01L 23/49822 |

* cited by examiner

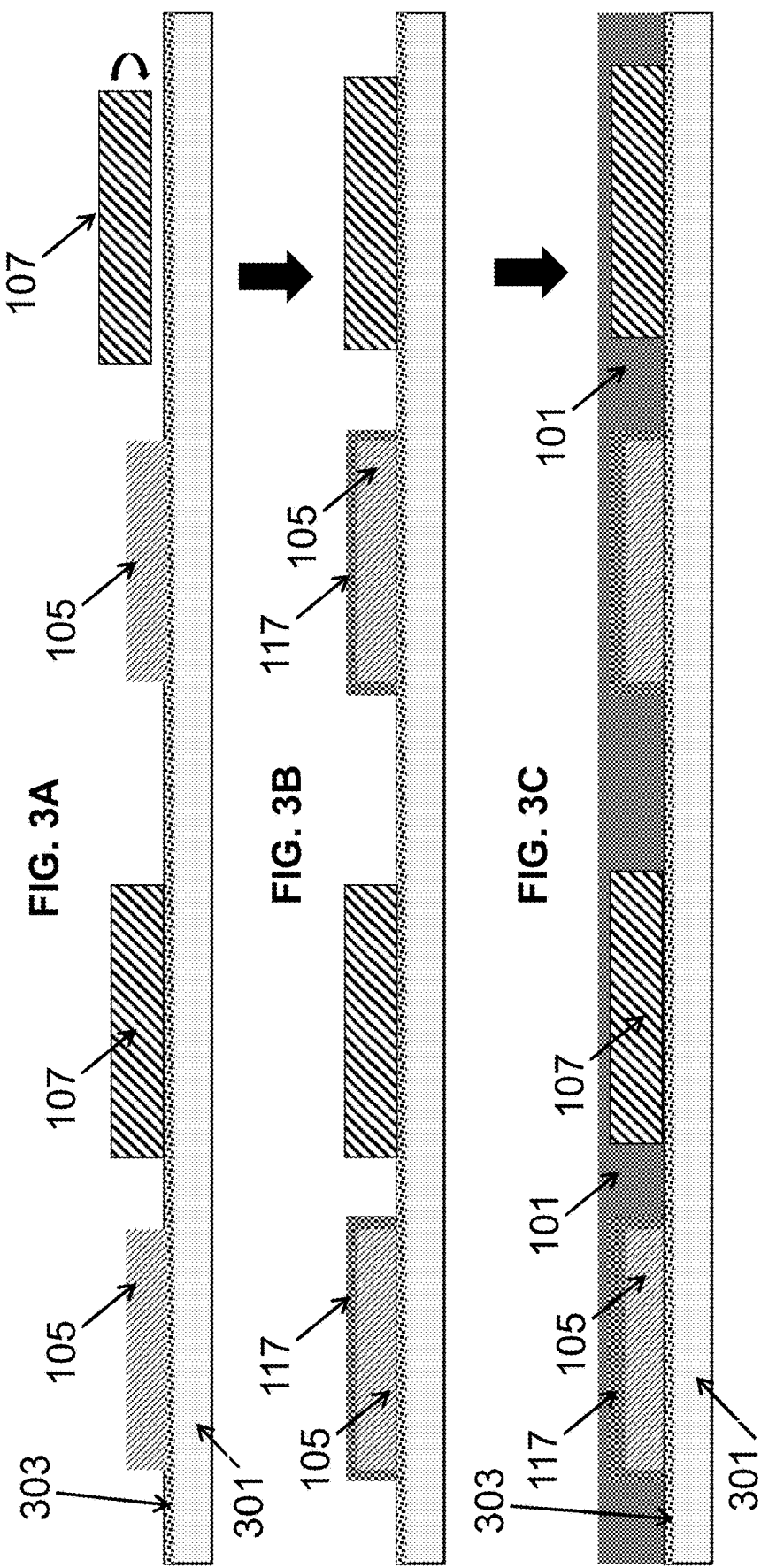

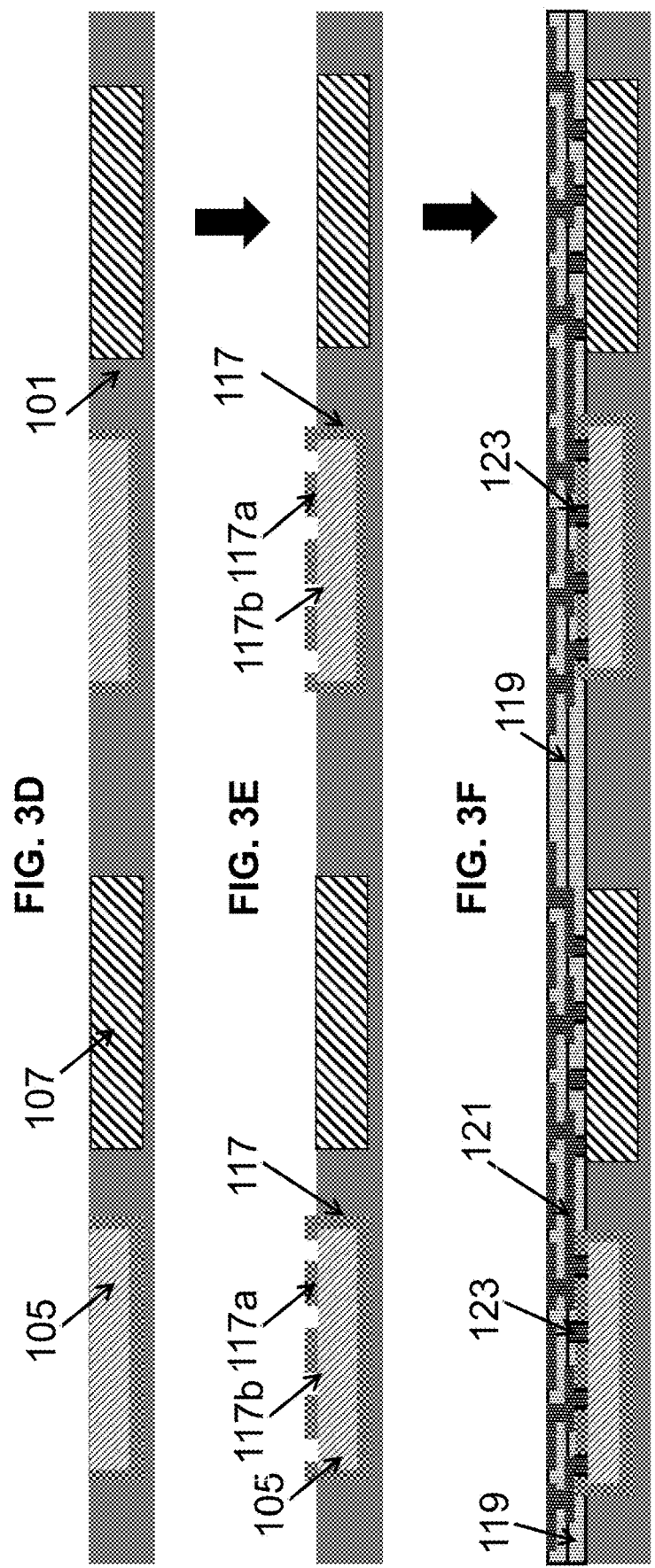

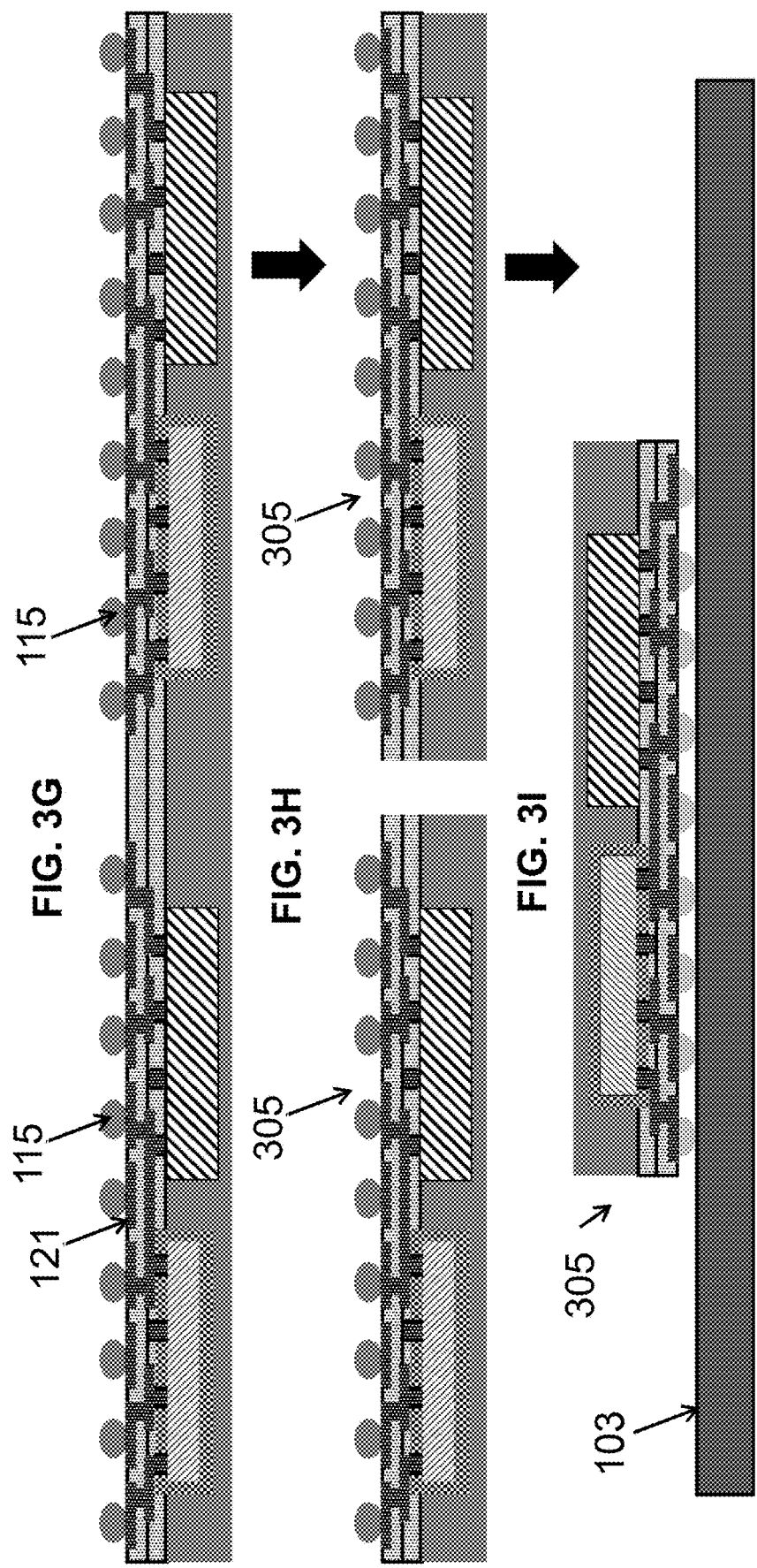

US 11,018,093 B2

MAGNETIC SHIELDING OF STT-MRAM IN MULTICHIP PACKAGING AND METHOD OF MANUFACTURING THE SAME

RELATED APPLICATION

The present application is a Divisional of U.S. application Ser. No. 15/878,139, filed on Jan. 23, 2018, now U.S. Pat. No. 10,361,162, which is incorporated herein by reference in its entirety.

TECHNICAL FIELD

The present disclosure relates semiconductor packaging. In particular, the present disclosure relates to magnetic shielding in multichip fanout packaging.

BACKGROUND

Dynamic random-access memory (DRAM) is a type of random access semiconductor memory that stores each bit of data in a separate capacitor within an integrated circuit. Due to its need of a system to perform refreshing, DRAM has more complicated circuitry (e.g., high density) and timing requirements, but it is widely used in the industry. Due to memory refresh cycles, DRAM consumes relatively high amounts of power and due to the scaling issue of DRAM, high latency issues are present. It is expected that magnetoresistive random access memory (MRAM), which stores data bits using magnetic states instead of the electrical charges used by DRAM, will replace DRAM in the future. In particular, spin-transfer torque (STT) is an effect in which the orientation of a MRAM magnetic layer in a magnetic tunnel junction or spin valve can be modified using a spin-polarized current. Magnetic shielding of a standalone STT-MRAM presents challenges.

A need therefore exists for methodology enabling formation of a standalone STT-MRAM with improved latency and power consumption and the resulting device.

SUMMARY

An aspect of the present disclosure is to provide a standalone STT-MRAM with improved system level power consumption compared to DRAM and the method of manufacturing the same. Another aspect of the present disclosure is to provide an integrated technology with improved latency by arranging a memory die in close proximity to a Fin Field Effect Transistor (FinFET) logic die. Yet another aspect includes providing wafer-level magnetic shielding in a multi-chip STT-MRAM fanout wafer level package and method of manufacturing the same. A further aspect includes providing a system level STT-MRAM integrated with other dies. Package thickness is low since no package substrate is used.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: placing MRAM dies and FinFET dies on a first surface of a mold frame; forming a top magnetic shield over top and side surfaces of the MRAM dies; forming a mold cover over the MRAM dies, FinFET dies and mold frame; removing the mold frame to expose a bottom surface of the MRAM dies and FinFET dies; and forming a bottom magnetic shield over the bottom surface of the MRAM dies.

Aspects of the present disclosure include forming a redistribution layer (RDL) over the mold cover, wherein the RDL includes metal pillars. Other aspects include solder reflowing and forming solder bumps over the metal pillars, wherein the metal pillars extend though patterned portions of the bottom magnetic shield. Additional aspects include dicing the mold to form multichips including at least one MRAM die and at least one FinFET die embedded in the mold cover. Further aspects include wherein each multichip includes an MRAM die, a FinFET die, a micro-electromechanical system (MEMS) die, NAND die, and a sensor die embedded in the mold cover. Yet other aspects include flipping and bonding the multichip to a printed circuit board by way of the solder bumps. Other aspects include the FinFET dies including logic FinFET dies and MRAM dies including STT-MRAM. Additional aspects include the top and bottom magnetic shield including a three-dimensional shield including a nickel-iron ferromagnetic alloy, or iron alloy which may have from zero to 6.5% silicon (Si:5Fe).

Another aspect of the present disclosure is a method including placing MRAM dies and logic dies on a first surface of a mold frame of a multichip fanout package; forming a top magnetic shield over top and side surfaces of the MRAM dies; forming a mold cover over the MRAM dies, logic dies and mold frame; removing the mold frame to expose a bottom surface of the MRAM dies and logic dies; and forming a bottom magnetic shield over the bottom surface of the MRAM dies.

Aspects include forming a redistribution layer (RDL) over the mold cover, wherein the RDL includes copper or aluminum pillars. Other aspects include solder reflowing and forming solder bumps over the copper or aluminum pillars, wherein the copper or aluminum pillars extend though patterned portions of the bottom magnetic shield. Additional aspects include dicing the mold to form multichips including at least one MRAM die and at least one logic die embedded in the mold cover, wherein the at least one logic die includes a FinFET die. Other aspects include each multichip including an MRAM die, a FinFET die, MEMS die, NAND die, and a sensor die embedded in the mold cover. Yet further aspects include flipping and bonding the multichip to a printed circuit board by way of the solder bumps. Additional aspects include the top and bottom magnetic shield having a three-dimensional shield including a nickel-iron ferromagnetic alloy, or iron alloy which may has from zero to 6.5% silicon (Si:5Fe).

According to the present disclosure, some additional technical effects may be achieved in part by a device including MRAM dies and logic dies formed in a mold cover of a multichip fanout package; and a RDL formed over the mold cover in contact with the MRAM and logic dies, wherein a top magnetic shield is formed over top and side surfaces of the MRAM dies, wherein a bottom magnetic shield is formed over a bottom surface of the MRAM dies, and wherein the RDL includes metal pillars extending through patterned openings of the bottom magnetic shield.

Aspects include wherein the logic dies being FinFET dies. Other aspects include wherein mold further including a MEMS die, NAND die, and a sensor die. Additional aspects include solder bumps formed over metal contacts formed in the RDL, wherein the metal contacts and metal pillars include copper or aluminum. Further aspects include the top and bottom magnetic shield including a three-dimensional shield having a nickel-iron ferromagnetic alloy, or iron alloy which has from zero to 6.5% silicon (Si:5Fe).

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 3A-3I illustrate a process flow for producing a multichip fanout wafer level package, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of sufficient magnetic shielding in multichip fanout packaging. In accordance with embodiments of the present disclosure, a system level MRAM integration with other dies is provided. A three-dimensional magnetic shield is formed during wafer level processing.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figures 1A, 1B:
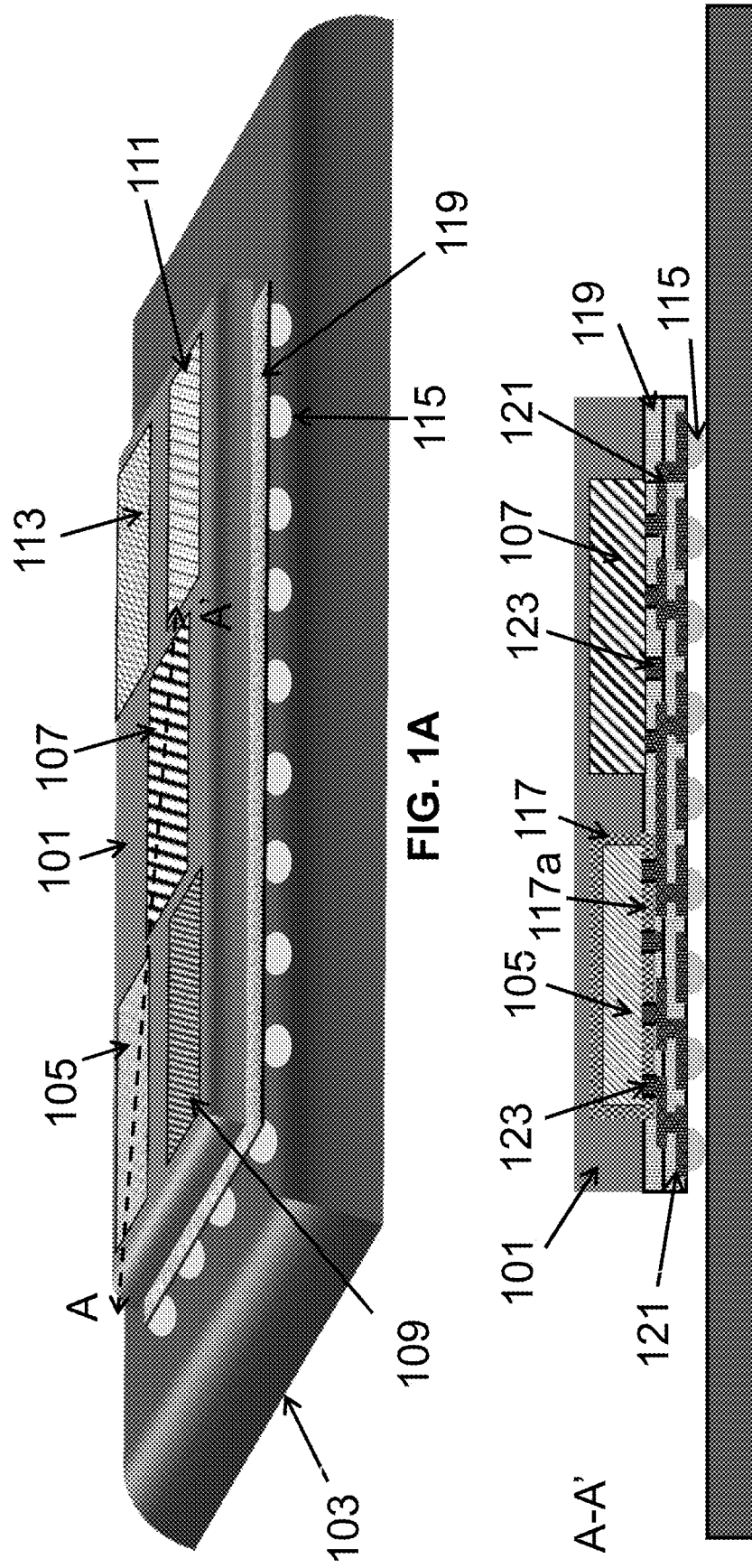
FIG. 1A illustrates, in top perspective side view, a multichip fanout package, in accordance with an exemplary embodiment.
FIG. 1B, illustrates, in cross sectional view along line A-A', the multichip fanout package of FIG. 1A.

FIG. 1A illustrates, in top perspective side view, a multichip fanout package. A mold 101 is formed over a printed circuit board (PCB) 103. The mold 101 can include an epoxy resin with high thermal conductivity and moldability. Embedded in the mold, are dies including a MRAM die 105, a FinFET die 107, MEMS die 109, NAND die 111, and sensor die 113 which are embedded or encapsulated in the mold 101. The mold 101 is attached to the PCB 103 by way of solder bumps 115.

FIG. 1B, illustrates the multichip fanout package, in cross sectional view, along line A-A' of FIG. 1A. The MRAM die 105 includes a magnetic shield 117 formed in a three-dimensional manner around the MRAM die 105. An RDL 121 is formed between the mold 101 and PCB 103. The RDL 121 includes metal wiring and metal pillars 123 on and within a polymer layer 119. The RDL in flip-chip designs is an extra metal layer that redistributes input/output (I/O) pads to bump pads without changing the I/O pad placement. The metal wiring and metal pillars 123 of the RDL 121 can include a metal such as copper (Cu), or aluminum (Al). The metal pillars 123 extend through patterned openings of a bottom surface 117a of the magnetic shield 117.

The three-dimensional magnetic shield 117 protects from all directions except the patterned openings in the bottom surface 117a of the magnetic shield 117. Magnetic tunneling junctions (MTJ) (not shown for simplicity) of STT-MRAM are not to be formed near the patterned openings in the bottom surface 117a of the magnetic shield 117. The magnetic shield 117 can include a nickel-iron ferromagnetic alloy (Mu-Metal®) or an iron alloy which may have from zero to 6.5% silicon (Si:5Fe) (E-steel).

Figure 2:
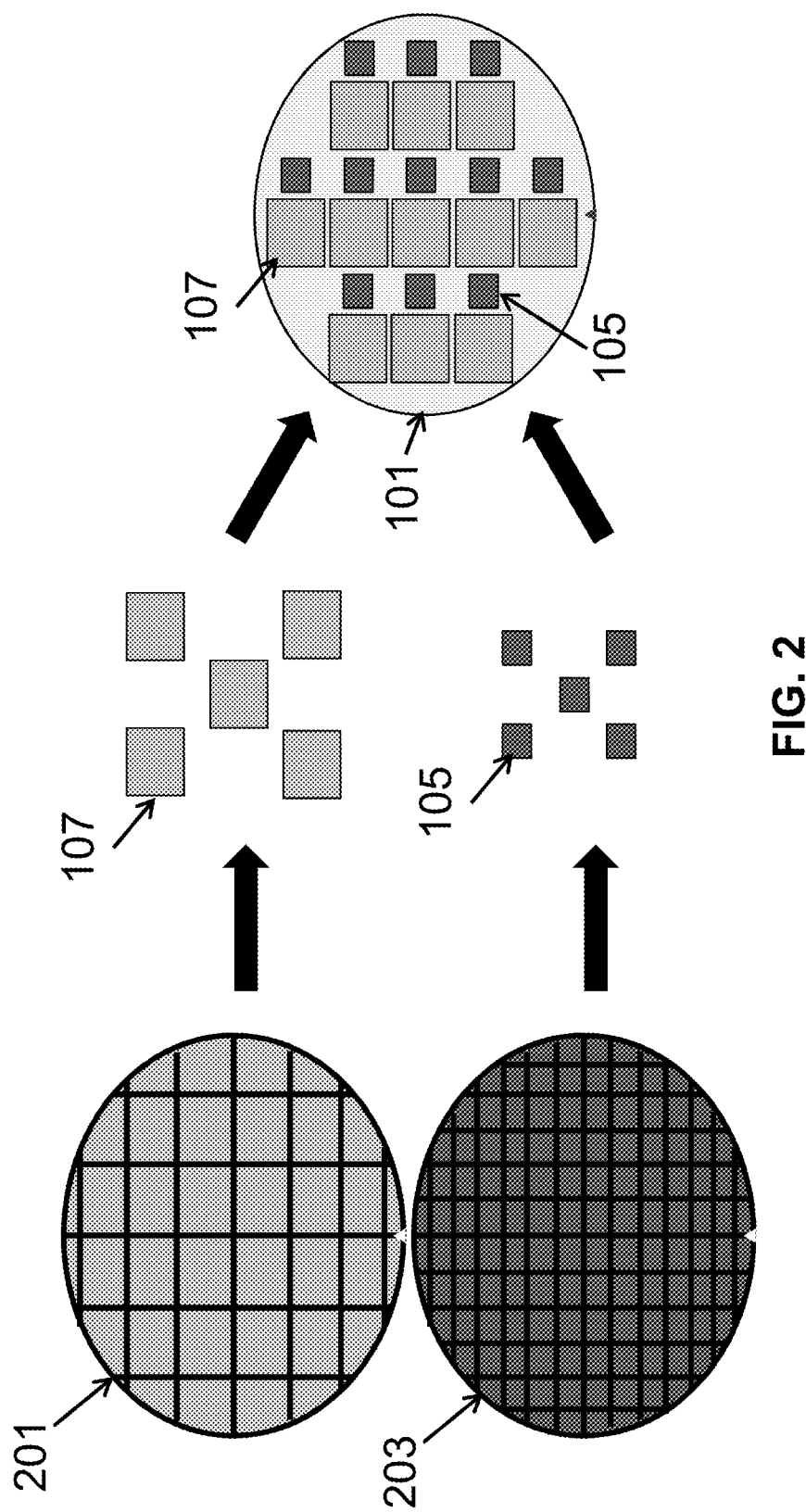
FIG. 2 illustrates a process diagram for producing a multichip fanout wafer level package, in accordance with an exemplary embodiment.

FIG. 2 illustrates a process diagram for producing a multichip fanout wafer level package. Wafer 201 includes logic dies 107, such as FinFET logic dies 107. Wafer 203 includes MRAM dies 105, such as STT-MRAM dies 105. A dicing step is performed to singulate the logic dies 107 and MRAM dies 105. A wafer reconstruction is performed with the temporary attachment of the dies 105 and 107 to a mold frame with an adhesive tape place on a surface of the mold frame to form a temporary bond of the dies 105 and 107 to the mold frame. As shown in FIG. 1A, additional dies can be embedded in the mold. Wafer level processing is performed to form the magnetic shield over the MRAM dies 105. A wafer level molding is formed by deposition of a mold 101, such as an epoxy resin to encapsulate or embed the dies 105 and 107 and the mold 101 is cured at a temperature below 200° C. The mold frame is de-bonded and the mold 101 is flipped over for wafer level processing of a bottom surface of the magnetic shield.

FIGS. 3A-3I illustrate a process flow for producing a multichip fanout wafer level package of FIGS. 1A and 1B. In FIG. 3A, a mold frame 301 is provided and includes an adhesive tape 303 attached to an upper surface of the mold frame 301. MRAM dies 105 and logic dies 107 are placed in close adjacent one another and attached to the mold frame 301 with the adhesive tape 303. Other dies illustrated in FIG. 1A can be attached in a similar manner.

In FIG. 3B, a wafer level processing is performed to form the magnetic shield 117 over the MRAM dies 105. The magnetic shield by be deposited with physical vapor deposition (PVD), electroplating (ECP), or other suitable deposition process for depositing the magnetic shield while the logic dies 107 are masked. The magnetic shield is formed to a thickness of 0.3 µm to 1 µm on side and top surfaces of the MRAM dies 105.

In FIG. 3C, a wafer level processing is performed to form the mold 101. The mold, which includes an epoxy resin, is deposited and cured to embed or encapsulate the dies 105 and 107. The mold can be deposited by way of dispensing and cured at a temperature below 200° C.

In FIG. 3D, the mold frame 301 and adhesive tape are detached to expose a bottom surface of the dies 105 and 107 that remain embedded in the mold 101. The mold 101 is then flipped upside down, as shown in FIG. 3D.

In FIG. 3E, a wafer level processing is performed to form the bottom portion 117a of the magnetic shield 117 over the MRAM dies 105. Once deposited to a thickness of 0.3 μm to the bottom portion of the magnetic shield 117 is patterned/etched to form openings 117b. Thickness of the deposited magnetic shield can be adjusted by way of PVD and ECP.

FIG. 3F illustrates the formation of the RDL 121 on one or more polymer layers 119. The polymer layer(s) 119 can include a polyimide HD-4100 or polybenzoxazole HD-8930 over the mold 101. The RDL 121 is an extra metal layer formed over the mold 101. The metal wiring and metal pillars 123 form the RDL 119. In FIG. 3G, a solder reflow at a temperature of 200 to 300° C. (e.g., 260° C.) is performed to attach solder bumps or micro solder bumps to contacts of the RDL 121. A dicing or cutting step is performed form a plurality of multichip fanout packages 305. The multichip fanout packages 305 are then flipped to connect to a PCB 103. As discussed above the multichip fanout packages 305 can include additional dies such as MEMS dies 109, NAND die 111, and sensor die 113 (FIG. 1A).

The embodiments of the present disclosure can achieve several technical effects include overcoming the technical challenges of shielding stand alone MRAM and STT-MRAM. An integration is provided to improve latency by bringing memory dies in close proximity to FinFET logic die in fanout packaging. Low power consumption of the MRAM in a fanout packaging is obtained. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   magnetoresistive random access memory (MRAM) dies and logic dies formed in a mold of a multichip fanout package; and
   a redistribution layer (RDL) formed in contact with the MRAM and logic dies,
   wherein a top magnetic shield is formed over top and side surfaces of the MRAM dies,
   wherein a bottom magnetic shield is formed over a bottom surface of the MRAM dies,
   wherein the RDL includes metal pillars extending through patterned openings of the bottom magnetic shield,
   wherein the mold further comprises at least one of a micro-electromechanical system (MEMS) die, non-volatile flash memory die, and a sensor die, and
   wherein the dies are formed in a planar arrangement in the mold.

2. The device according to claim 1, wherein the logic dies comprises Fin Field Effect Transistor (FinFET) dies.

3. The device according to claim 1, wherein the MRAM dies comprise spin-transfer torque (STT) MRAM.

4. The device according to claim 1, wherein the non-volatile flash memory die comprises a NAND die.

5. The device according to claim 1, further comprising solder bumps formed over metal contacts formed in the RDL.

6. The device according to claim 5, wherein the metal contacts and metal pillars comprise copper or aluminum.

7. The device according to claim 1, wherein the top and bottom magnetic shield comprises a three-dimensional shield.

8. The device according to claim 7, wherein the three-dimensional shield comprises a nickel-iron ferromagnetic alloy, or and iron alloy having from zero to 6.5% silicon (Si:5Fe).

9. A device comprising:
   magnetoresistive random access memory (MRAM) dies and logic dies formed in a mold of a multichip fanout package; and
   a redistribution layer (RDL) in contact with the MRAM and logic dies,
   wherein the MRAM dies comprise spin-transfer torque (STT) MRAM,
   wherein a bottom magnetic shield is formed over a bottom surface of the MRAM dies,
   wherein the dies are formed in a planar arrangement in the mold, and
   wherein the RDL includes metal pillars extending through patterned openings of the bottom magnetic shield.

10. The device according to claim 9, wherein a top magnetic shield is formed over top and side surfaces of the MRAM dies.

11. A device comprising:
    magnetoresistive random access memory (MRAM) dies and Fin Field Effect Transistor (FinFET) dies formed in planar arrangement in a mold of a multichip fanout package;
    a top magnetic shield formed over surfaces of the MRAM dies; and
    a bottom magnetic shield formed over an exposed bottom surface of the MRAM dies.

12. The device according to claim 11, further comprising:
    a redistribution layer (RDL), wherein the RDL includes metal pillars.

13. The device according to claim 12, further comprising:
    solder bumps formed over the metal pillars, wherein the metal pillars extend though patterned portions of the bottom magnetic shield.

14. The device according to claim 13, further comprising:
    diced multichips comprising at least one MRAM die and at least one FinFET die embedded in the mold.

15. The device according to claim 14, wherein each diced multichip comprises an MRAM die, a FinFET die, a micro-electromechanical system (MEMS) die, NAND die, and a sensor die embedded in the mold.

16. The device according to claim 15, further comprising:
    a printed circuit board bonded to one or more of the diced microchips.

17. The device according to claim 15, wherein the FinFET dies comprise logic FinFET dies and the MRAM dies comprise spin-transfer torque (STT) MRAM.

18. A device comprising:
    a mold of a multichip fanout package, the mold comprising a magnetoresistive random access memory (MRAM) die, a Fin Field Effect Transistor (FinFET) die, a micro-electromechanical system (MEMS) die, a sensor die and a non-volatile flash memory die,
wherein the mold is connected to a printed circuit board (PCB), and
wherein the dies are formed in a planar arrangement in the mold.

\* \* \* \* \*